(12) United States Patent
Best et al.

(10) Patent No.: US 8,262,975 B2
(45) Date of Patent: Sep. 11, 2012

(54) SELF-RELEASING RESIST MATERIAL FOR NANO-IMPRINT PROCESSES

(75) Inventors: Margaret E. Best, San Jose, CA (US); Xing-Cai Guo, Tracy, CA (US); Thomas E. Karis, Aromas, CA (US); Dan S. Kercher, Santa Cruz, CA (US); Charles M. Mate, San Jose, CA (US); Tsai-Wei Wu, San Jose, CA (US)

(73) Assignee: HGST Netherlands B.V, Amsterdam (NL)

(*) Notice: Subject to any disclaimer, the term of this patent is extended or adjusted under 35 U.S.C. 154(b) by 738 days.

(21) Appl. No.: 12/268,823

(22) Filed: Nov. 11, 2008

(65) Prior Publication Data

US 2010/0117256 A1 May 13, 2010

(51) Int. Cl.
*B27N 3/08* (2006.01)
(52) U.S. Cl. .......................... 264/319; 977/887
(58) Field of Classification Search .................. 264/319; 977/887
See application file for complete search history.

(56) References Cited

U.S. PATENT DOCUMENTS

| | | | |
|---|---|---|---|
| 4,565,714 A * | 1/1986 | Koshar | 427/515 |
| 6,585,948 B1 | 7/2003 | Ryoo et al. | |
| 2003/0207202 A1* | 11/2003 | Fujita et al. | 430/270.1 |
| 2004/0200411 A1 | 10/2004 | Willson et al. | |
| 2005/0146079 A1 | 7/2005 | Chou | |
| 2006/0021533 A1 | 2/2006 | Jeans | |
| 2006/0021967 A1 | 2/2006 | Lee | |
| 2006/0131785 A1 | 6/2006 | Sewell | |
| 2006/0175736 A1 | 8/2006 | Xu | |
| 2006/0214330 A1 | 9/2006 | Dumond et al. | |
| 2007/0121375 A1 | 5/2007 | Sewell | |
| 2007/0205524 A1 | 9/2007 | Best | |
| 2007/0238037 A1 | 10/2007 | Wuister | |
| 2009/0011367 A1* | 1/2009 | Omatsu et al. | 430/287.1 |

OTHER PUBLICATIONS

Chou, et al, "Nanoimprint Lithography," Journal of Vacuum Science & Technology B: Microelectronics and Nanometer Structures, Nov. 1996, abstract, vol. 14, Issue 6, University of Minnesota, Minneapolis, MN.
Bailey et al., "Step and Flash Imprint Lithography: Template Surface Treatment and Defect Analysis," Journal of Vacuum Science & Technology B: Microelectronics and Nanometer Structures, abstract, Nov. 2000, vol. 18, Issue 6, University of Texas, Austin, Texas.
Resnick et al., "Release Layers for Contact and Imprint Lithography," Semiconductor International, Jun. 2002, 4 pages, University of Texas, Austin, Texas.

* cited by examiner

*Primary Examiner* — Christina Johnson
*Assistant Examiner* — Galen Hauth
(74) *Attorney, Agent, or Firm* — Duft Bornsen & Fishman, LLP

(57) ABSTRACT

Nanoimprint lithography using resist material with the addition of a surfactant is described. A template release layer is formed on a pattern of a template. A non-ionic surfactant is added to a resist material to form a mixed resist material. The resist material may comprise a hydrocarbon material having an unsaturated bond, such as an acrylate material. The surfactant may comprise polyalkylene glycol or an organically modified polysiloxane. A resist layer is then formed on a substrate from the mixed resist material. The surfactant added to the resist material forms a resist release layer on the surface of the resist layer. The template is then pressed into the resist layer, where the template release layer and the resist release layer are between the pattern of the template and the resist layer.

15 Claims, 4 Drawing Sheets

SELF-RELEASING RESIST MATERIAL FOR NANO-IMPRINT PROCESSES

BACKGROUND OF THE INVENTION

1. Field of the Invention

The invention is related to the field of nanometer-scale imprinting and, in particular, to a resist material having self-releasing properties that is used in nanometer-scale imprinting processes.

2. Statement of the Problem

Nanoimprint lithography is a high-throughput method for imprinting nanometer-scale patterns on a substrate. One particular use for nanoimprint lithography is for manufacturing disk drives. Disk drive manufacturers strive to increase the recording density of drive systems. One way to increase the recording density is to pattern the surface of the magnetic disk to form discrete data tracks, referred to as discrete track recording (DTR). A magnetic disk utilizing DTR typically includes a series of concentric raised zones, which are referred to herein as pillars, providing a medium for storing data.

To imprint the nanometer-scale patterns on a substrate (i.e., a substrate for a magnetic disk), a master tool is first fabricated having a desired pattern. The master tool is not typically used for imprinting an actual substrate as it can be quickly worn out when a large number of imprints are needed. The master tool is expensive and time consuming to fabricate, so the master tool instead is used to fabricate a plurality of stamper tools. The stamper tools are actually used for imprinting the substrates (i.e., replicating the pattern on the stamper tools on the substrates).

To fabricate a stamper tool, the master tool is pressed into a layer of resist material to imprint the inverse pattern of the master tool in the resist layer. Heat or ultraviolet (UV) irradiation may then be applied to cure the resist layer in the inverse pattern of the master tool, which forms a cured resist layer. The master tool is then removed from the cured resist layer leaving a stamper tool having a desired pattern. The stamper tool may then be used to imprint a plurality of substrates.

To imprint a substrate, the stamper tool is pressed into a thin layer of resist material deposited on the substrate to imprint the inverse pattern of the stamper tool in the resist layer. Heat or UV irradiation may then be applied to cure the resist layer in the inverse pattern of the stamper tool, forming a cured resist layer. The stamper tool is then separated from the cured resist layer which leaves a substrate with a desired resist pattern covering the substrate. An etching process, such as Reactive Ion Etching (RIE), may then be performed to pattern the substrate according to the resist pattern. A similar process is performed to replicate the pattern in many substrates using the stamper tool.

When the stamper tool is pressed into a resist layer and the resist layer is cured, some of the cured resist layer may stick to the stamper tool. The stamper tool (and also the master tool) may be referred to generally herein as a "template". The resist layer and the template have relatively high surface energies, and the adhesion between the cured resist layer and the template is greater than the cohesion of the resist layer itself. The resist layer fractures internally leaving behind a residue of resist material which obscures the nanometer-scale features on the template. To avoid problems of having residue stick to the template, a release layer is formed on the template from some type of anti-adhesion material. The release layer has anti-adhesion properties (low surface energy and low friction) so that the resist material will not stick to the template when it is separated from the resist layer, as the cured resist layer needs to be perfectly separated from the template without leaving behind any residue and with the smallest possible force required to accomplish the separation.

Unfortunately, problems still exist in present nano-imprint processes. Even though release layers are used, the adhesion force between the template and the cured resist layer remains high. This high adhesion force acts to incrementally remove the release layer from the template as the template is used for replication. Because a template is used for many replications, the release layer can be quickly worn away. The result is residue sticking to the template, which obscures the nanometer-scale features on the template.

SUMMARY

Embodiments of the invention solve the above and other related problems by adding a non-ionic surfactant to the resist material to form a mixed resist material. The mixed resist material is then used to form a resist layer on a substrate. One portion (or block) of the surfactant is substantially soluble in the resist material, while the other portion of the surfactant is less soluble in the resist material, and separates out along the surface of the resist material. Thus, when the resist material with the added surfactant is used to form a resist layer on a substrate, the insoluble portion of the surfactant forms an additional release layer on the surface of the resist layer. The additional release layer advantageously reduces the adhesion forces between the template and the cured resist layer. This improves the release between template and the cured resist layer, and extends the useful life of the release layer on the template. The result is that the template can be used for more replications, which increases manufacturing productivity.

One embodiment comprises a method of performing nanoimprint lithography. The method includes forming a template release layer on a pattern of a template. The template release layer may be comprised of a fluorinated release layer, such as a perfluoropolyether diacrylate. The method further includes adding a non-ionic surfactant to a resist material to form a mixed resist material. The resist material may comprise a hydrocarbon material having an unsaturated bond, such as an acrylate material. The surfactant may comprise polyalkylene glycol, an organically modified polysiloxane, or some other material. The method further includes forming a resist layer on a substrate from the mixed resist material. The surfactant added to the resist material forms a resist release layer on the surface of the resist layer. The method further includes pressing the template into the resist layer, where the template release layer and the resist release layer are between the pattern of the template and the resist layer. By having the template release layer and the resist release layer act as a barrier between the pattern of the template and the resist layer, the adhesion forces between the template and the resist layer is advantageously reduced. This advantageously improves the subsequent separation between the template and the resist layer.

The invention may include other exemplary embodiments described below.

DESCRIPTION OF THE DRAWINGS

The same reference number represents the same element or same type of element on all drawings.

DETAILED DESCRIPTION

FIGS. 1-8 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
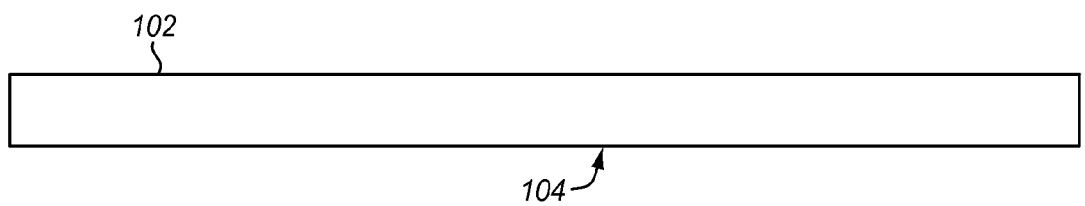
FIG. 1 illustrates a template in an exemplary embodiment of the invention.
Figure 2:
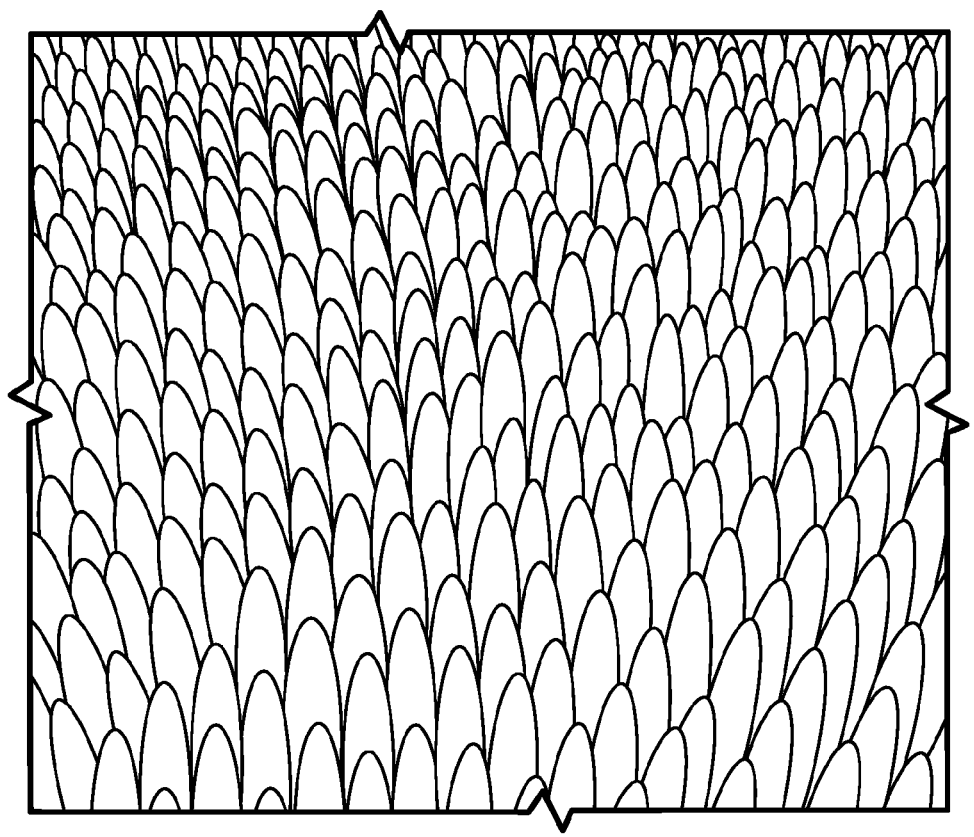
FIG. 2 is a magnified isometric view of an exemplary pattern that may be used on a template in an exemplary embodiment of the invention.

FIG. 1 illustrates a template 102 in an exemplary embodiment of the invention. Template 102 may comprise a master tool, a stamper tool, or any other tool used for replication in nanoimprint lithography. Template 102 may be formed from quartz or some other material, and includes a pattern 104 on one of its surfaces. Pattern 104 has a nanometer-scale pattern, such as hole/pillar pattern, that is used for replication on a substrate, and thus is not visible in FIG. 1. FIG. 2 is a magnified isometric view of an exemplary pattern 104 that may be used on template 102 in an exemplary embodiment of the invention.

Figure 3:
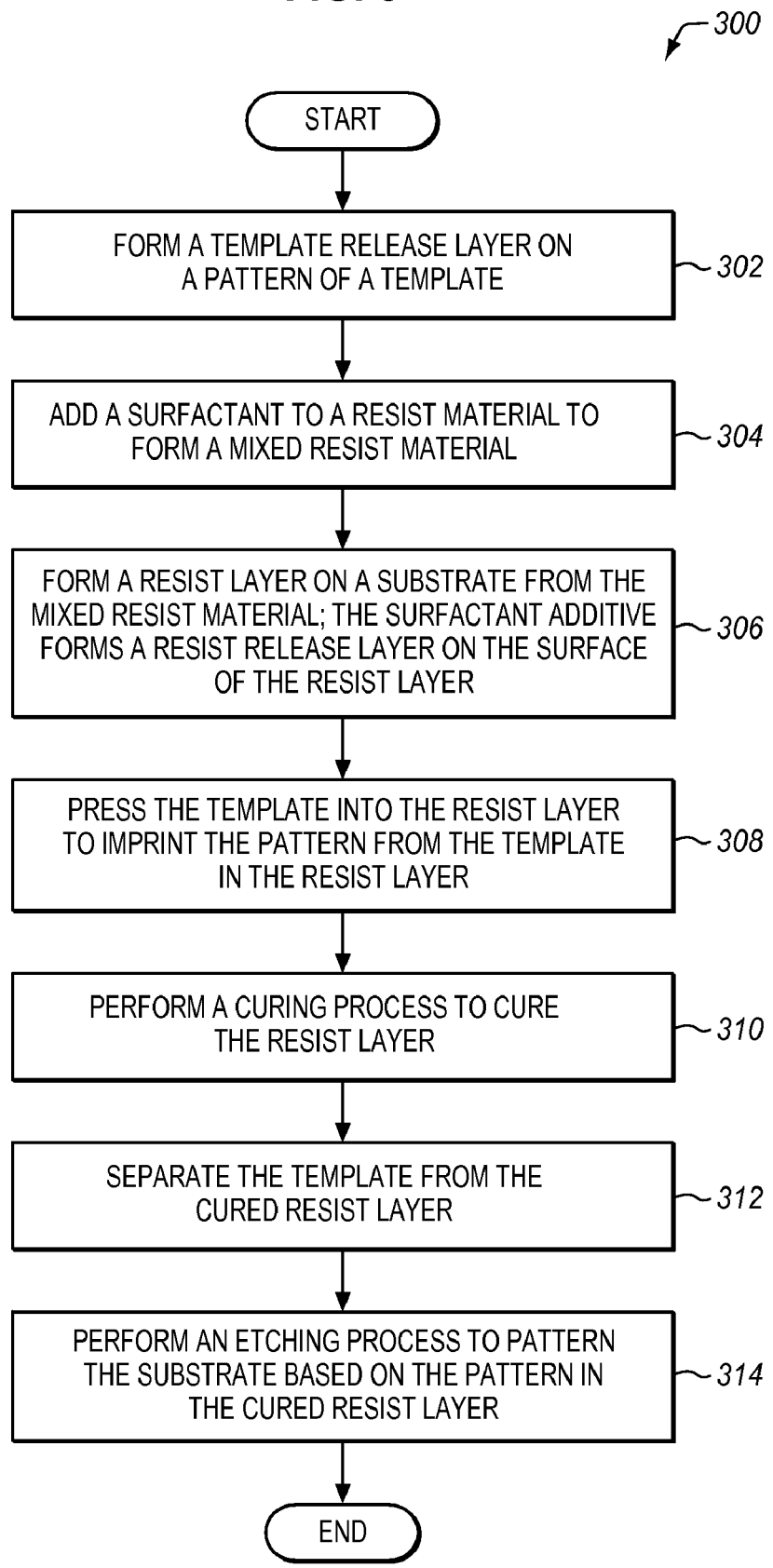
FIG. 3 is a flow chart illustrating a method of performing nanoimprint lithography in an exemplary embodiment of the invention.

FIG. 3 is a flow chart illustrating a method 300 of performing nanoimprint lithography in an exemplary embodiment of the invention. The steps of method 300 will be described with reference to FIGS. 4, 6, and 8. The steps of the flow chart in FIG. 3 are not all inclusive and may include other steps not shown.

Figure 4:
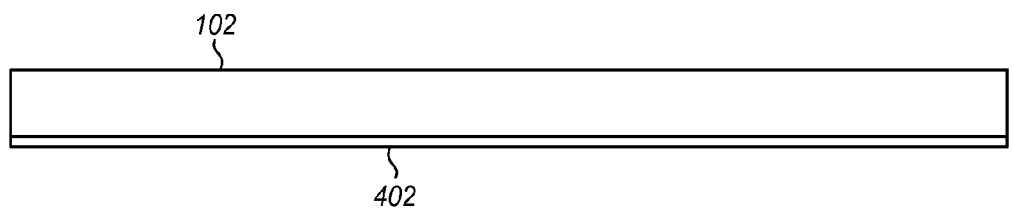
FIG. 4 illustrates a template release layer formed on a template in an exemplary embodiment of the invention.

In step 302, a release layer is formed on the pattern 104 of template 102 with an anti-adhesion material. A release layer comprises any material or coating having anti-adhesion properties. The release layer formed on the template 102 is referred to herein as a template release layer. FIG. 4 illustrates a template release layer 402 formed on template 102 in an exemplary embodiment of the invention. Template release layer 402 may be formed by dipping the pattern 104 of template 102 in an anti-adhesion material, and then curing the anti-adhesion material through exposure to ultraviolet irradiation or heat. The result is a very thin layer of anti-adhesion material formed on pattern 104 of template 102. In the embodiment described herein, template release layer 402 is formed from a fluorinated anti-adhesion material, such as a perfluoropolyether diacrylate material. The anti-adhesion material of template release layer 402 may alternatively be referred to as a perfluoro polymer, a fluorinated molecule with diacrylate end groups, a perfluoropolyether with diacrylate end groups, etc. The water contact angle on the template release layer 402 should be at least 900, and is preferably 100° or higher.

Template 102 will subsequently be used to imprint a resist layer that is formed on a substrate from resist material. Resist material comprises a light-sensitive material used in photolithography to form a patterned coating on a surface of a substrate. In the embodiments described herein, the resist material comprises a hydrocarbon material having an unsaturated bond. One example of a hydrocarbon material having an unsaturated bond comprises an acrylate monomer, such as neopentyl glycol dimethacrylate, trimethylpropane triacrylate, propoxylated glyceryl triacrylate, isobornyl methacrylate, and octyldecyl acrylate. The resist material may also be referred to as a polymerizable composition or a photo-polymerizable material.

Figure 5:
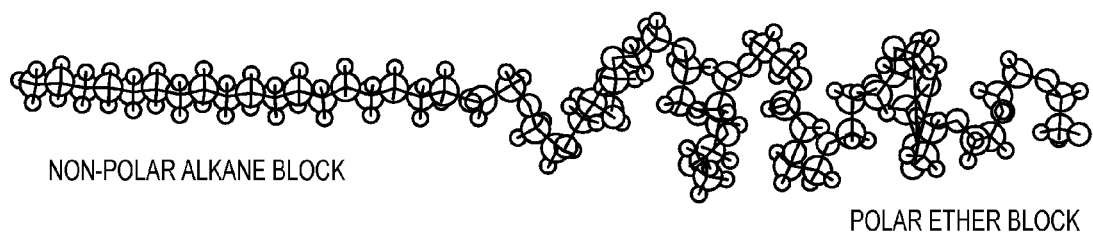
FIG. 5 is a schematic illustration of a polyalkylene glycol material ($C_{18}H_{37}(OCH_2CH_2)_{20}OH$).

Before the resist material is deposited on the substrate, a surfactant is added to, or dissolved in, the resist material to form a mixed resist material in step 304 of FIG. 3. The mixed resist material represents the material formed when the surfactant is added to the resist material. A surfactant is an agent that acts to lower the interfacial tension between two liquids. In this embodiment, a non-ionic surfactant (i.e., a surfactant that carries no net charge) is added to the resist material. One example of a non-ionic surfactant is polyalkylene glycol. FIG. 5 is a schematic illustration of a polyalkylene glycol material ($C_{18}H_{37}(OCH_2CH_2)_{20}OH$). Another example of a non-ionic surfactant is an organically modified polysiloxane (OM-PDMS). The concentration of the surfactant in the resist material is in the range of about 0.05% to 5% by weight. If the concentration of the surfactant in the resist material is too high, lumps will form in the resist material which is undesirable. If the concentration of the surfactant in the resist material is too low, the surfactant will provide no benefit. The viscosity of the mixed resist material is in the range of about 1 to 100 mPa-s. The mixed resist material should be sufficiently transparent to UV light and free of solids or gel that are larger than 50 nm, and preferably contains no molecular aggregates or micelles that are larger than 5 nm.

Figure 6:
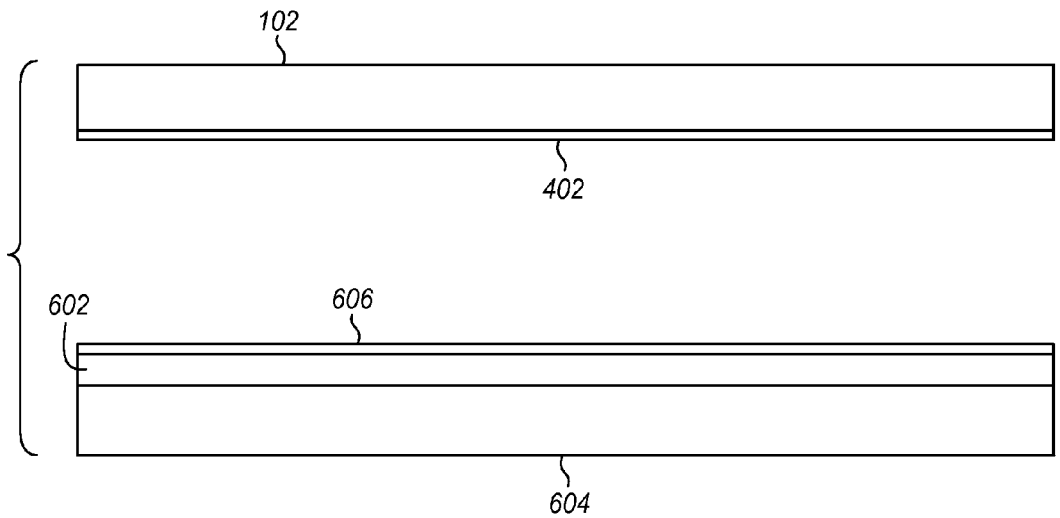
FIG. 6 illustrates a resist layer formed on a substrate in an exemplary embodiment of the invention.

In step 306 of FIG. 3, a resist layer is formed on a substrate from the mixed resist material. A substrate comprises any wafer or material that is to be imprinted, such as a magnetic disk for magnetic storage. The mixed resist material is deposited on the substrate to form the resist layer. FIG. 6 illustrates the resist layer 602 formed on the substrate 604 in an exemplary embodiment of the invention. In FIG. 6, the mixed resist material is deposited on the substrate 604 to form the resist layer 602. The addition of the surfactant to the resist material of the resist layer 602 forms a release layer 606 on the surface of the resist layer 602. The release layer 606 formed on the surface of the resist layer 602 is referred to herein as the resist release layer. The resist release layer 606 is formed because the surfactant is partially soluble in the resist material, and partially insoluble. The surfactant is designed to provide the proper oleophobic/oleophilic balance for compatibility with the hydrocarbon resist material while also forming a low surface energy release layer 606 on the surface of the resist layer 602.

Figure 7:
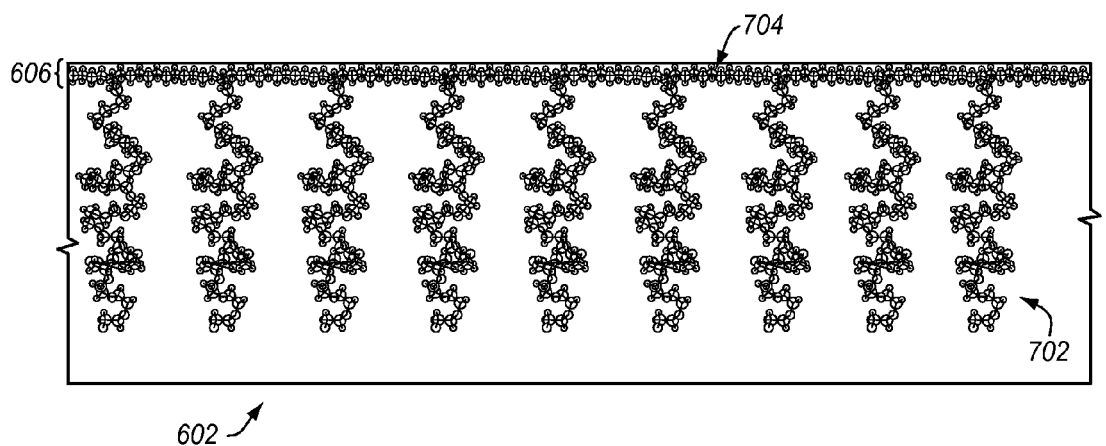
FIG. 7 is a schematic illustration of the formation of a resist release layer on a resist layer in an exemplary embodiment of the invention.

For example, a polyalkylene glycol surfactant has two blocks: one block is a non-polar alkane, and the other block is a polar ether (see also FIG. 5). The polar ether block is more soluble in the resist material, while the non-polar alkane block is less soluble and separates out along the surface of the resist material. The non-polar alkane blocks thus form a low energy layer (i.e., resist release layer 606) on the surface of the resist layer 602. FIG. 7 is a schematic illustration of the formation of the resist release layer 606 on the resist layer 602 in an exemplary embodiment of the invention. As is illustrated in FIG. 7, the polar ether block 702 is more soluble in the resist material and is thus dissolved within the resist material. The non-polar alkane block 704 is less soluble and separates out along the surface of resist layer 602. The non-polar alkane blocks thus form a low energy layer (i.e., resist release layer 606) on the surface of the resist layer 602.

In another example, an organically modified polysiloxane (OM-PDMS) surfactant has two parts: one part is a siloxane chain, and the other part is the organic modifier side chain. The organic modifier is selected to be soluble in the resist material, while the siloxane chain is insoluble and separates out along the surface of the resist material. The organic modifier may comprise an alkane, an alkyl ester, a functionalized aromatic, or their combinations. The molecular weight of the OM-PDMS polymer is in the range of about 500 to 5000, with the molecular weight of the organic modifier being in the range of about 50 to 500. An organically modified polysiloxane may also be referred to as a non-ionic organo-modified trisiloxane (OMT) or a polyether modified polysiloxane (PMP).

Figure 8:
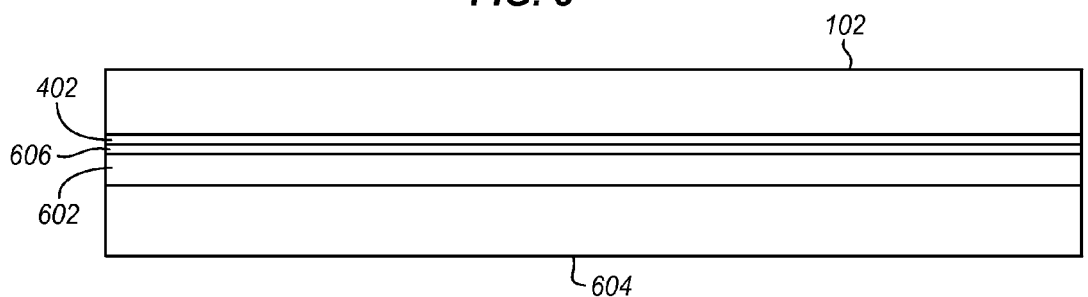
FIG. 8 illustrates a template pressed into a resist layer in an exemplary embodiment of the invention.

In step 308 of FIG. 3, template 102 is pressed into the resist layer 602 on substrate 604 to imprint the pattern 104 in template 102 into resist layer 602 (see also FIG. 1). More specifically, the pattern 104 of template 102 having the template release layer 402 is pressed into the surface of resist layer 602 having the resist release layer 606. FIG. 8 illustrates template 102 pressed into the resist layer 602 in an exemplary embodiment of the invention. As shown in FIG. 8, there are essentially two release layers between template 102 and resist layer 602. One is the template release layer 402, and the other is the resist release layer 606 formed through the addition of the surfactant in the resist material. In step 310 of FIG. 3, a curing process is performed to cure the resist layer 602 in the form of the pattern 104 on template 102 (see also FIG. 1) to form a cured resist layer. The curing process may include applying heat or UV irradiation to the resist layer 602 to harden the resist layer 602 in the inverse pattern of template 102. In step 312, template 102 is separated or removed from the cured resist layer. Because the resist release layer 606 is formed on the surface of resist layer 602, the adhesive force between template release layer 402 and the cured resist layer is reduced. This provides multiple advantages. One advantage is that there is a reduced risk of a residue remaining on the pattern 104 of the template 102 after the template 102 is removed from the cured resist layer. Another advantage is that the template release layer 402 will not be removed from the surface of template 102 as quickly. Thus, template 102 may be used for many more replications.

In step 314, an etching process (e.g., Reactive Ion Etching (RIE)) or some other process is performed to pattern or etch the substrate 604 based on the pattern imprinted in the cured resist layer. The desired pattern on substrate 604 may be a hole/pillar pattern or another type of pattern desired in nanometer-scale processes. The cured resist layer may then be removed from substrate 604.

Although specific embodiments were described herein, the scope of the invention is not limited to those specific embodiments. The scope of the invention is defined by the following claims and any equivalents thereof.

We claim:

1. A method of performing an imprint process, the method comprising:
    forming a template release layer on a pattern of a template;
    adding a non-ionic surfactant to a resist material to form a mixed resist material, wherein the non-ionic surfactant comprises polyalkylene glycol;
    forming a resist layer on a substrate from the mixed resist material, wherein the surfactant added to the resist material forms a resist release layer on the surface of the resist layer; and
    pressing the template into the resist layer, wherein the template release layer and the resist release layer are between the pattern of the template and the resist layer.

2. The method of claim 1 wherein the polyalkylene glycol surfactant has a non-polar alkane block and a polar ether block, the polar ether block is more soluble in the resist material than the non-polar alkane block so that the non-polar alkane block separates out along the surface of the resist layer to form the resist release layer.

3. The method of claim 1 wherein the concentration of the surfactant in the resist material is in the range of about 0.05% to 5% by weight.

4. The method of claim 1 wherein the resist material comprises an acrylate material.

5. The method of claim 4 wherein the acrylate material comprises one of a neopentyl glycol dimethacrylate, trimethylpropane triacrylate, propoxylated glyceryl triacrylate, isobornyl methacrylate, or octyldecyl acrylate.

6. The method of claim 1 wherein the template release layer comprises a fluorinated release layer.

7. The method of claim 6 wherein the fluorinated release layer is formed from a perfluoropolyether diacrylate material.

8. The method of claim 1 further comprising:
    performing a curing process to cure the resist layer, wherein the pattern from the template is imprinted in the cured resist layer;
    separating the template from the cured resist layer; and
    performing an etching process to pattern the substrate based on the pattern imprinted in the cured resist layer.

9. A method of performing nanoimprint lithography, the method comprising:
    forming a template release layer on a nanometer-scale pattern of a template;
    adding a polyalkylene glycol surfactant to a resist material to form a mixed resist material, wherein the resist material comprises a hydrocarbon with an unsaturated bond;
    forming a resist layer on a substrate from the mixed resist material, wherein the surfactant added to the resist material forms a resist release layer on the surface of the resist layer; and
    pressing the template into the resist layer, wherein the template release layer and the resist release layer are between the pattern of the template and the resist layer.

10. The method of claim 9 wherein the concentration of the polyalkylene glycol surfactant in the resist material is in the range of about 0.05% to 5% by weight.

11. The method of claim 9 wherein the resist material comprises an acrylate material.

12. The method of claim 11 wherein the acrylate material comprises one of a neopentyl glycol dimethacrylate, trimethylpropane triacrylate, propoxylated glyceryl triacrylate, isobornyl methacrylate, or octyldecyl acrylate.

13. The method of claim 9 wherein the template release layer comprises a fluorinated release layer.

14. The method of claim 13 wherein the fluorinated release layer is formed from a perfluoropolyether diacrylate material.

15. The method of claim 9 further comprising:
    performing a curing process to cure the resist layer, wherein the pattern from the template is imprinted in the cured resist layer;
    separating the template from the cured resist layer; and
    performing an etching process to pattern the substrate based on the pattern imprinted in the cured resist layer.

* * * * *

UNITED STATES PATENT AND TRADEMARK OFFICE
CERTIFICATE OF CORRECTION

| | | |
|---|---|---|
| PATENT NO. | : 8,262,975 B2 | Page 1 of 1 |
| APPLICATION NO. | : 12/268823 | |
| DATED | : September 11, 2012 | |
| INVENTOR(S) | : Best et al. | |

It is certified that error appears in the above-identified patent and that said Letters Patent is hereby corrected as shown below:

In column 4 line 2, the text "release layer 402 should be at least 900, and is preferably 100°" should read -- release layer 402 should be at least 90°, and is preferably 100° --

Signed and Sealed this
Twenty-seventh Day of November, 2012

David J. Kappos
*Director of the United States Patent and Trademark Office*